United States Patent
Haruta et al.

[19]

[11] Patent Number: 5,929,706
[45] Date of Patent: Jul. 27, 1999

[54] AUTOMATIC GAIN CONTROL METHOD AND DEVICE

[75] Inventors: Tsutomu Haruta; Kazuo Kumano, both of Kanagawa, Japan

[73] Assignee: Sony Corporation, Tokyo, Japan

[21] Appl. No.: 08/843,251

[22] Filed: Apr. 14, 1997

[30] Foreign Application Priority Data

Apr. 24, 1996 [JP] Japan .................................. 8-102299

[51] Int. Cl.⁶ .................................................. H03G 3/30
[52] U.S. Cl. ........................................... 330/279; 330/282
[58] Field of Search ................................... 330/279, 278, 330/85, 282, 86

[56] References Cited

U.S. PATENT DOCUMENTS

| | | | |
|---|---|---|---|
| 4,670,719 | 6/1987 | Sakurai | 330/279 |
| 4,910,797 | 3/1990 | Min et al. | 455/249 |
| 5,051,707 | 9/1991 | Fujita | 330/279 |
| 5,117,201 | 5/1992 | Luther | 330/279 |
| 5,422,601 | 6/1995 | Kovacs et al. | 330/279 |

FOREIGN PATENT DOCUMENTS

A-52627/93  7/1994  Australia.

0 604 295 A1  6/1994  European Pat. Off..

*Primary Examiner*—Robert Pascal
*Assistant Examiner*—Khanh Van Nguyen
*Attorney, Agent, or Firm*—Frommer Lawrence & Haug, LLP.; William S. Frommer

[57] ABSTRACT

An automatic gain control method and device capable of maintaining the gain within a predetermined proper range by first amplifying an input analog signal from a microphone or the like, then sampling the amplified analog signal while comparing the voltage thereof with a predetermined reference voltage, and when the number of times that the voltage of the amplified analog signal is higher than the reference voltage exceeds a predetermined number of times, varying the gain of the amplified analog signal stepwise in response to every excess beyond the predetermined number of times. Consequently it becomes possible to eliminate the necessity of an input amplifier of a sufficient bandwidth and an A-D converter, hence realizing manufacture of an improved device composed of a single-chip CMOS integrated circuit, with further advantages of minimizing the number of required component parts, reducing the production processes, achieving a higher integration density and lowering the power consumption.

5 Claims, 4 Drawing Sheets

AUTOMATIC GAIN CONTROL METHOD AND DEVICE

BACKGROUND OF THE INVENTION

1. Field of the Invention

The present invention relates to an automatic gain control method and an automatic gain control device adapted for maintaining the level of an amplified analog signal within a proper range when processing the input analog signal from a microphone, line or the like through conversion of the the same into a digital signal.

2. Description of the Related Art

In processing an analog signal inputted from a microphone or the like, audio distortion and so forth are generated in the sound if the level of the analog signal fails to be within a predetermined range. In order to eliminate such a disadvantage, it is generally customary to execute automatic gain control for adjusting any excessive level of the analog signal automatically to a an adequate level.

An exemplary automatic gain control device known heretofore is formed of a bipolar integrated circuit as a whole, and it comprises a detector for detecting the level of an input signal by first rectifying the input signal via a diode and then smoothing the same through a combination of a capacitor and a discharge resistor, and a variable gain amplifier (VGA) for varying the gain in accordance with the signal level detected by such a detector.

In an exemplary known system which converts an input analog signal into a digital signal and outputs the same, there is employed an automatic gain control device for first converting the analog signal into a digital signal by an A-D converter and then varying the gain digitally by a digital amplifier.

In the recent digital technology, it is strongly demanded that an automatic gain control device be constituted of a MOS integrated circuit having various merits in comparison with a bipolar integrated circuit, inclusive of a smaller number of required component parts, a reduced number of production processes, a higher integration density and a lower power consumption.

However, in the automatic gain control system which executes analog-to-digital conversion of an input analog signal and then varies the gain digitally, the analog signal input circuit cannot be placed under control, so that it becomes necessary to employ an amplifier having a sufficiently wide frequency band and an A-D converter. Consequently, some difficulties are unavoidable in manufacturing an automatic gain control device in the form of a MOS integrated circuit.

SUMMARY OF THE INVENTION

It is therefore an object of the present invention to provide an automatic gain control method and an automatic gain control device adapted for production in the form of a MOS integrated circuit.

According to one aspect of the present invention, there is provided an automatic gain control method which comprises the steps of amplifying an input analog signal, then sampling the amplified analog signal while comparing the voltage thereof with a predetermined reference voltage, and when the number of times that the voltage of the amplified analog signal is higher than the reference voltage exceeds a predetermined number of times, varying the gain of the amplified analog signal stepwise in response to every excess beyond the predetermined number of times, thereby maintaining the gain within a predetermined proper range.

And according to another aspect of the present invention, there is provided an automatic gain control device which comprises an amplifying means for amplifying an input analog signal, and an A-D converter for converting the amplified analog signal into a digital signal. The amplifying means consists of a variable gain amplifier for amplifying the input analog signal while varying the gain stepwise in conformity with a feedback control signal and then outputting the amplified analog signal, and a digital detector for comparing the voltage of the amplified analog signal with a predetermined reference signal and, when the voltage of the amplified analog signal is higher, counting the value of a counter, and then supplying the feedback control signal, which is based on the counted value, to the variable gain amplifier. In this device, every time the counted value of the counter exceeds a predetermined value, the gain of the variable gain amplifier is varied stepwise. The amplifying means is composed of a single-chip CMOS integrated circuit.

In this manner, an input analog signal from a microphone, line or the like is amplified and sampled, and then the sampled signal is compared with a reference voltage so that any excessive amplified analog signal is detected. Subsequently, resistance taps are switched in accordance with the number of detections of any excessive voltage to vary stepwise the gain outputted from the amplifier, thereby maintaining the output level of the analog signal within a proper range. Furthermore, due to such gain control relative to the analog signal, it becomes possible to eliminate the necessity of an input amplifier of a sufficient bandwidth and an A-D converter, hence realizing manufacture of an improved device composed of a single-chip CMOS integrated circuit, to consequently reduce the number of required component parts and the number of production processes with further merits of a higher integration density and a lower power consumption.

The above and other features and advantages of the present invention will become apparent from the following description which will be given with reference to the illustrative accompanying drawings.

DESCRIPTION OF THE PREFERRED EMBODIMENTS

Figure 1:
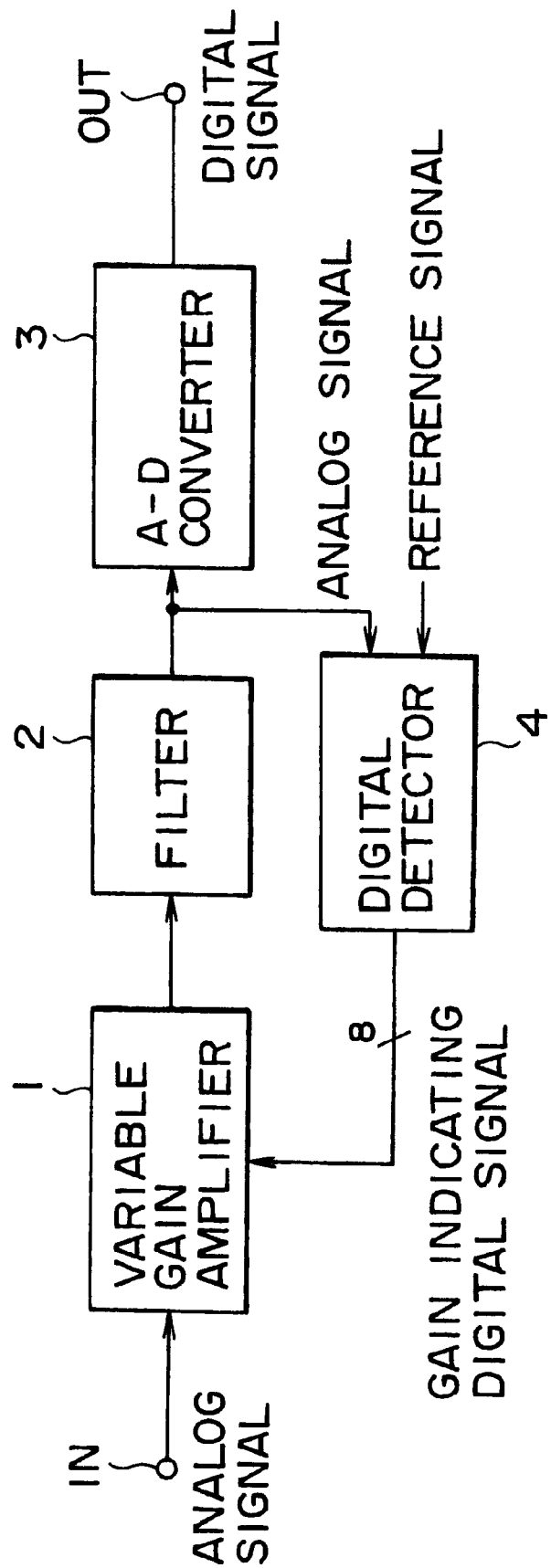
FIG. 1 is a block diagram showing a preferred embodiment of an automatic gain control device which represents an automatic gain control method of the present invention.

A preferred embodiment of an automatic gain control device representing an automatic gain control method of the present invention comprises, as shown in FIG. 1, a variable gain amplifier 1, a filter 2, an A-D converter 3 and a digital detector 4. In this device, means for amplification consists of a variable gain amplifier 1, a filter 2 and a digital detector 4.

In FIG. 1, an analog signal obtained from a microphone, line or the like is fed via an input terminal IN to a variable gain amplifier 1. As will be described later, the variable gain amplifier 1 is so formed as to vary the gain stepwise.

The filter 2 has a function to limit the frequency band of the analog signal outputted from the variable gain amplifier 1. The analog signal obtained from this filter 2 is supplied to the A-D converter 3 and the digital detector 4.

The A-D converter 3 converts the input analog signal into a digital signal and feeds the same to an output terminal OUT. The digital signal obtained from this output terminal OUT is delivered as an output of the automatic gain control device of the present invention.

The digital detector 4 receives the amplified analog signal passed through the filter 2 and then samples the analog signal at a clock frequency sufficiently higher than the frequency of the amplified analog signal. An external reference voltage is supplied to the digital detector 4 as a reference signal having a predetermined voltage level.

Such digital detector 4 compares, at each time of such sampling, the voltage level of every sample with the predetermined voltage level of the reference signal and, when the number of times that the voltage level of the sample is higher than that of the reference signal exceeds a predetermined value, the digital detector 4 instructs the variable gain amplifier 1 to execute feedback for lowering the gain via a gain indicating digital signal which serves as a feedback control signal composed of 8-bit digital data.

In response to the gain indicating digital signal serving as a feedback control signal, the variable gain amplifier 1 decodes the gain indicating digital signal obtained from the digital detector 4 and functions, in accordance with the content of the decoded signal, to lower the gain by a certain number of steps such as, e.g., one step.

In this manner, the variable gain amplifier 1, the filter 2 and the digital detector 4 cooperate to adjust the output level automatically through feedback control.

Figure 2:
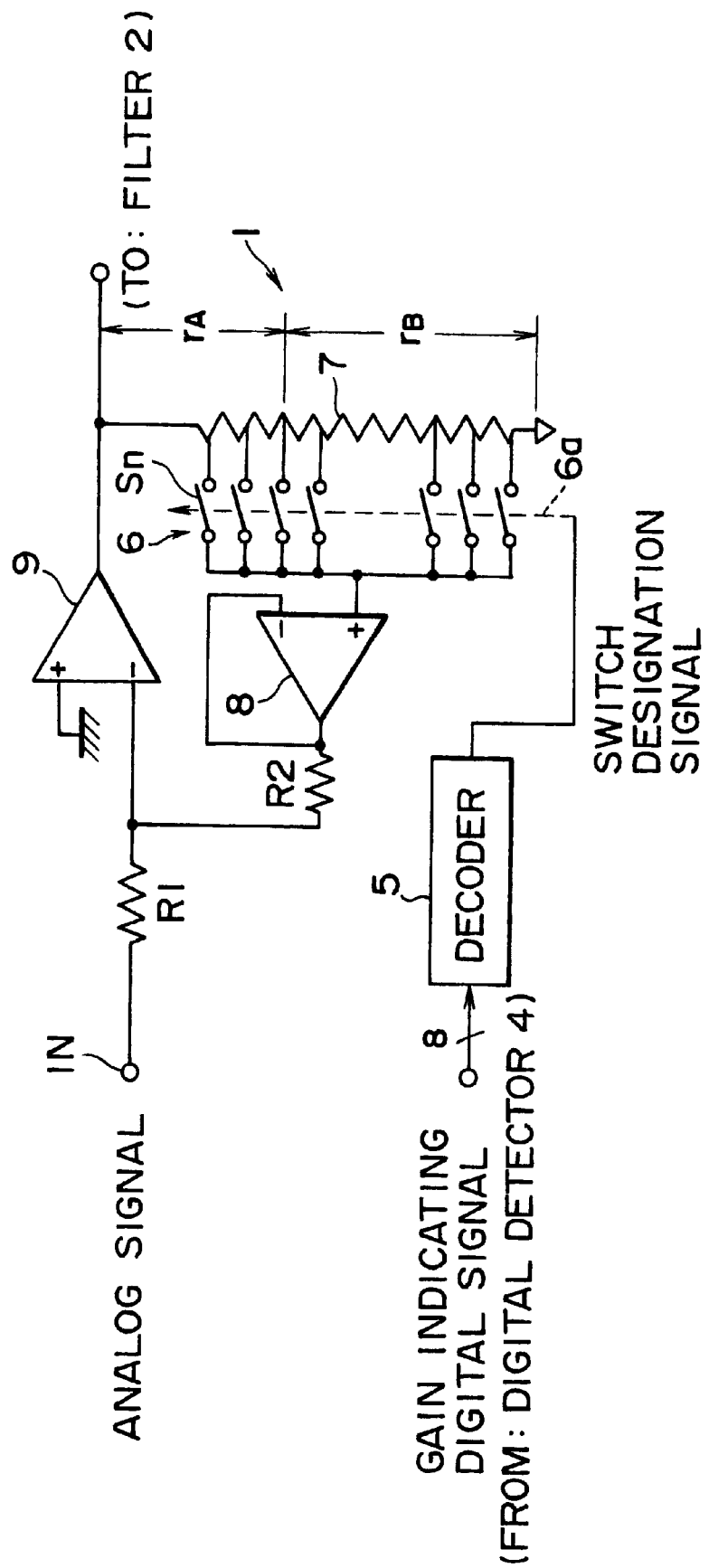
FIG. 2 is an explanatory diagram showing an embodiment of a variable gain amplifier in the device of FIG. 1.

FIG. 2 shows an embodiment of the variable gain amplifier 1 included in the device of FIG. 1.

In FIG. 2, the variable gain amplifier 1 consists of a decoder 5 connected to the output terminal of the digital detector 4; a switch group 6 having a plurality of on/off switches controlled to be turned on or off by the output signal of the decoder 5; a resistor 7 having a plurality of taps connected respectively to terminals on one side of the on/off switches of the switch group 6, the resistor 7 being connected at one end thereof to the input terminal of the filter 2 while being grounded at the other end thereof; an operational amplifier 8 whose minus input terminal is connected to its output terminal and whose plus input terminal is connected to the common terminal on the other side of the switches of the switch group 6; two resistors R1 and R2 connected in series between the output terminal of the operational amplifier 8 and the input terminal IN; and another operational amplifier 9 whose minus input terminal is connected to a junction of the resistors R1 and R2 while whose plus input terminal is grounded, and whose output terminal is connected to one end of the resistor 7 and also to the input terminal of the filter 2.

The decoder 5 decodes the 8-bit gain indicating digital signal outputted as a feedback control signal from the digital detector 4 and, depending on the decoded content, outputs a switch designation signal, which designates one switch to be turned on out of the entire M switches of the switch group 6, to a tap controller 6a of the switch group 6.

The M on/off switches of the switch group 6 are controllable to be turned on or off individually by the tap controller 6a. More specifically, when the switch designation signal outputted from the decoder 5 designates the nth switch, the tap controller 6a turns on (connects) only the switch $S_n$ out of the entire M switches $S_1$–$S_M$ while turning off the other switches.

The resistor 7 has M taps disposed at equal intervals, and therefore each of the resistance values between mutually adjacent two taps is the same. And when the switch $S_n$ out of the entire M switches $S_1$–$S_M$ of the switch group 6 is turned on, the total resistance value r of the resistor 7 is divided by the tap, which is connected to the switch $S_n$, into the output-side resistance value $r_A$ with respect to the filter 2 and the ground-side resistance value $r_B$ (i.e., $r=r_A+r_B$).

Consequently, it follows that the resistance value $r_A$ is inserted between the plus input terminal of the operational amplifier 8 and the output terminal of the operational amplifier 9.

Therefore, the total gain G of the variable gain amplifier 1 is expressed as $$G=-(r_2/r_1)\times(r_A+r_B)/r_B$$

In the above, $r_1$ and $r_2$ denote the resistance values of the resistors R1 and R2, respectively.

Thus, the resistance values $r_A$ and $r_B$ are changed respectively by changing the switch $S_n$ which is turned on, thereby varying the gain G of the variable gain amplifier 1.

Figure 3:
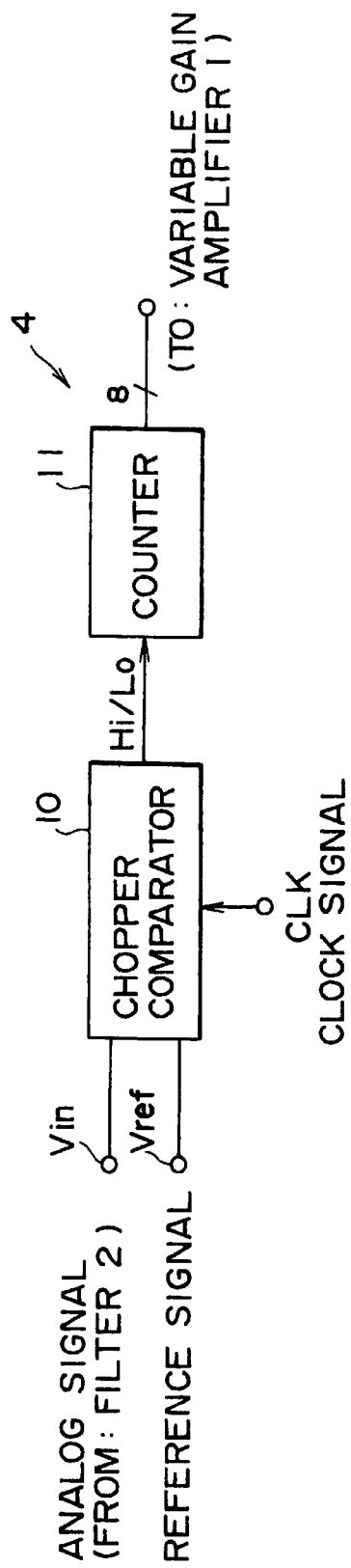
FIG. 3 is an explanatory diagram showing an embodiment of a digital detector in the device of FIG. 1.

FIG. 3 shows an embodiment of the digital detector 3 included in the device of FIG. 1.

In FIG. 3, the digital detector 3 consists of a chopper comparator 10 and a counter 11.

The chopper comparator 10 has an input terminal Vin to receive the analog signal outputted from the filter 2, an input terminal Vref to receive a reference signal based on the aforementioned reference voltage, and an input terminal CLK to receive a clock signal.

The chopper comparator 10 has a function of receiving, at its input terminal CLK, a clock signal of a frequency sufficiently higher than the frequency of the analog signal outputted from the filter 2, and sampling the analog signal in accordance with the clock signal; a function of comparing the value of each sample data obtained as a result of such sampling with the reference signal level corresponding to the reference voltage; and another function of outputting to the counter 11 either a signal Hi or a signal $L_o$ when the value of the sample data obtained as a result of such comparison is higher or lower than the reference signal level corresponding to the reference voltage.

The counter 11 counts the number of times that a signal Hi is outputted from the chopper comparator 10 and, when the number exceeds a preset value $N_1$, increments by a predetermined value $N_2$ the content of the 8-bit data of the gain indicating digital signal outputted to the variable gain amplifier 1.

The preset values $N_1$ and $N_2$ of the counter 11 are determined adequately according to an attack time and a recovery time which are included in the requisite performance with regard to the automatic gain control device.

In the automatic gain control device having the variable gain amplifier 1 and the digital detector 4 mentioned above, when the content of the 8-bit data of the gain indicating digital signal outputted from the counter 11 in the digital detector 3 is incremented as a result of any excessive level of the analog signal, the decoder 5 in the variable gain amplifier 1 decodes the 8-bit data and sends a switch designation signal, which serves to designate the number of the switch to be turned on, to the tap controller 6a of the switch group 6. Consequently, the gain G of the variable gain amplifier 1 is varied as described.

Figure 4:
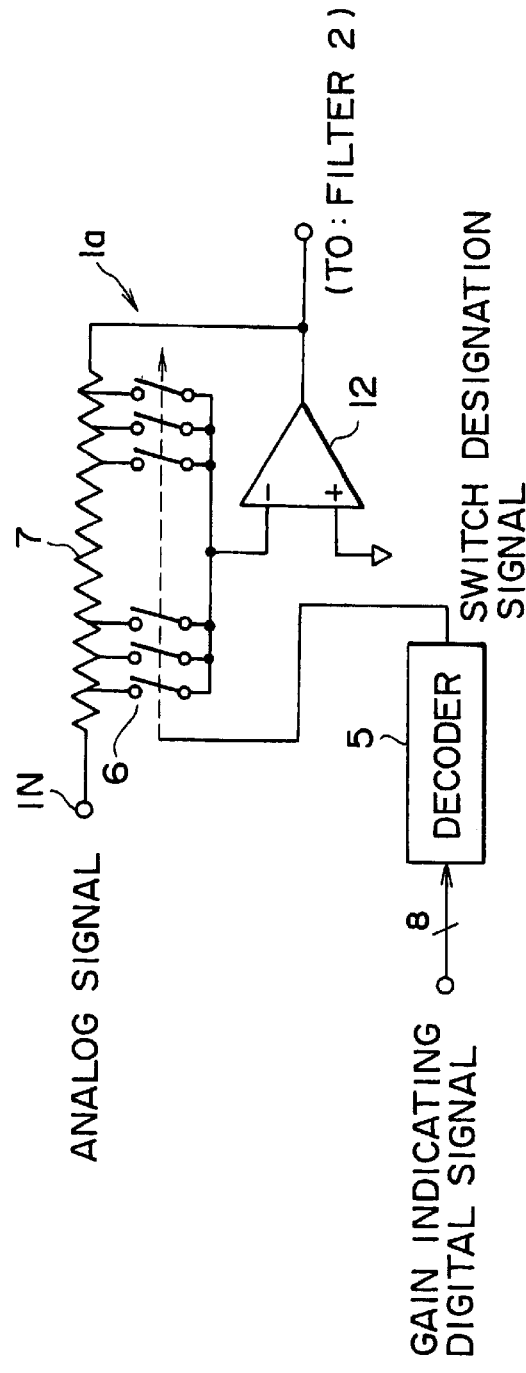
FIG. 4 is an explanatory diagram showing another embodiment of the variable gain amplifier in the device of FIG. 1.
Figure 5:
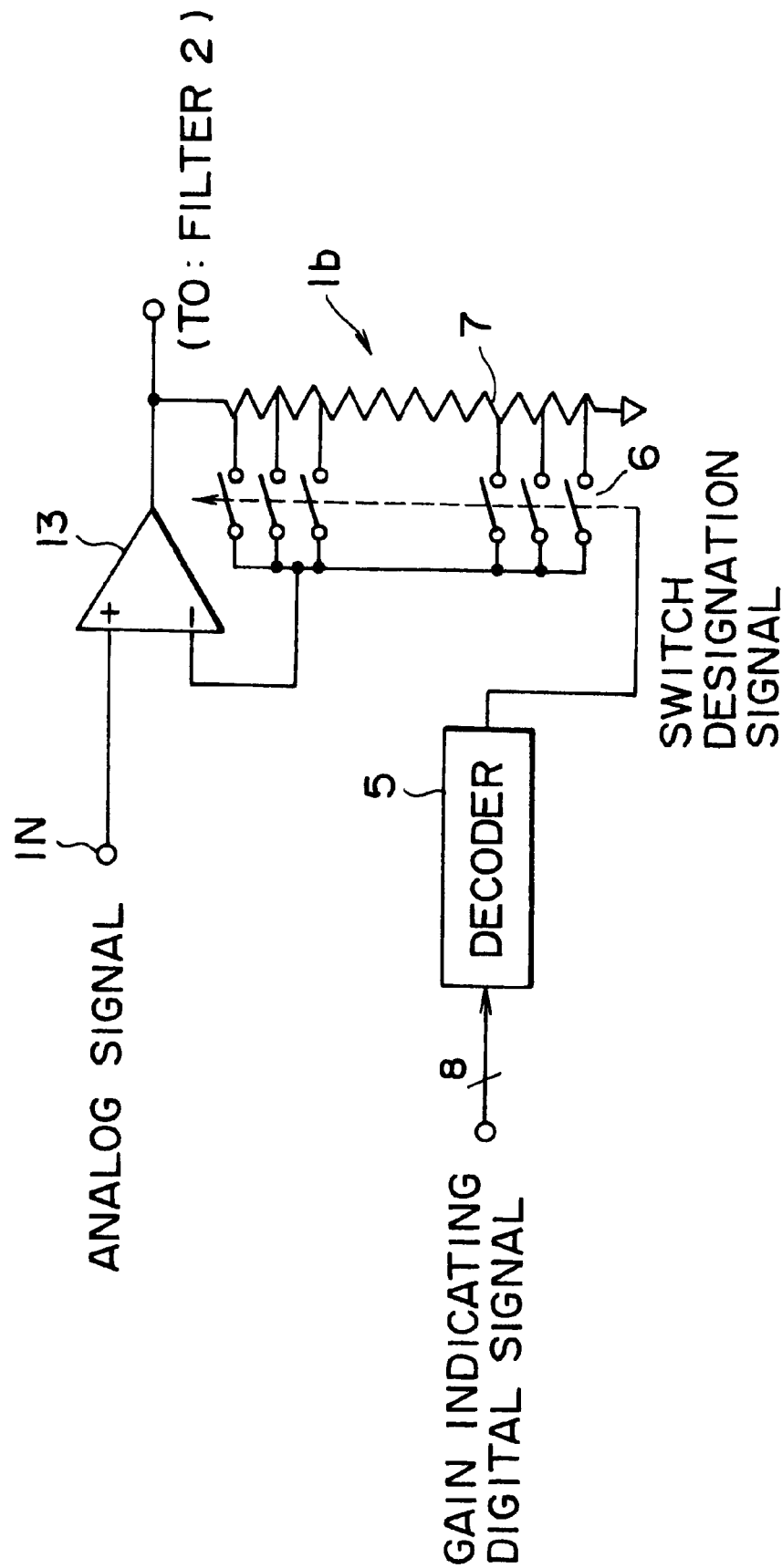
FIG. 5 is an explanatory diagram showing a further embodiment of the variable gain amplifier in the device of FIG. 1.

FIGS. 4 and 5 show other preferred embodiments of the variable gain amplifier.

The variable gain amplifier 1*a* shown in FIG. 4 is so formed that a resistor 7 is connected directly between its input terminal IN for receiving an analog signal and its output terminal to the filter 2. And the common terminal of a plurality of switches of a switch group 6 is connected to a minus input terminal of an operational amplifier 12.

Since the variable gain amplifier 1*a* of the above structure includes merely one operational amplifier 12, it becomes possible to achieve an improved circuit configuration of a simplified structure with a low power consumption. However, as the input impedance is widely changed in this circuit configuration, it may be used in a suitable case where such impedance change causes no problem.

The variable gain amplifier 1*b* shown in FIG. 5 is so formed that its input terminal IN for receiving an analog signal is connected to a plus input terminal of an operational amplifier 13, and a minus input terminal thereof is connected to the common terminal of a plurality of switches of a switch group 6.

Since the variable gain amplifier 1*b* of the above structure includes merely one operational amplifier 13, it becomes possible to achieve an improved circuit configuration of a simplified structure with a low power consumption. Although there exists a possibility in this circuit configuration that slight distortion may be generated in the output signal due to change in the operating point of the amplifier 13, it may be used in a suitable case where such change causes no problem.

As described, according to the automatic gain control device of the present invention, an input analog signal obtained from a microphone, line or the like is first amplified, then the voltage thereof is compared with a reference voltage, and the gain is controlled stepwise in conformity with the number of times that the analog signal voltage is higher than the reference voltage, whereby the analog signal to be converted into a digital signal can be maintained within a proper level range. Consequently, it becomes possible to reduce the distortion and so forth in the signal processed digitally.

Further, due to such gain control of the analog signal, the amplifying means can be composed of a single-chip CMOS integrated circuit to thereby achieve advantageous effects of minimizing the number of required component parts, lowering the power consumption, and reducing the production processes.

Although the present invention has been described hereinabove with reference to some preferred embodiments thereof, it is to be understood that the invention is not limited to such embodiments alone, and a variety of other changes and modifications will be apparent to those skilled in the art without departing from the spirit of the invention.

The scope of the invention, therefore, is to be determined solely by the appended claims.

What is claimed is:

1. An automatic gain control method comprising the steps of:

amplifying an input analog signal;

sampling the analog input signal while comparing the voltage thereof with a predetermined reference voltage; and varying the gain of the amplified analog signal in a stepwise manner each time the voltage of the amplified signal is higher than the reference voltage for at least a predetermined number of samples greater than one thereby maintaining the gain within a predetermined proper range.

2. The automatic gain control method according to claim 1, wherein the amplified analog signal is passed through a filter, and the voltage thereof is compared with said predetermined reference voltage.

3. An automatic gain control device comprising:

an amplifying means for amplifying an input analog signal; and an A-D converter for converting the amplified analog signal into a digital signal;

wherein said amplifying means comprises a variable gain amplifier for amplifying the input analog signal while varying the gain in a stepwise manner in conformity with a feedback control signal, and for then outputting the amplified signal; and a digital detector for comparing the voltage of the amplified analog signal with a predetermined reference signal and incrementing the value of a counter when the voltage of the amplified analog signal is higher than said reference signal, and for then supplying said feedback control signal to said variable gain amplifier, which is based on the counter value;

wherein the gain of said variable gain amplifier is varied in a stepwise manner under the control of said feedback control signal every time the counted value of said counter exceeds a predetermined value.

4. The automatic gain control device according to claim 3, wherein the amplified analog signal is passed through a filter, and the voltage thereof is compared with said predetermined reference voltage.

5. The automatic gain control device according to claim 3, wherein said amplifying means is composed of a single-chip CMOS integrated circuit.

* * * * *